United States Patent
Tange et al.

(10) Patent No.: US 10,602,614 B2
(45) Date of Patent: Mar. 24, 2020

(54) POWER SUPPLY MODULE AND POWER SUPPLY DEVICE

(71) Applicant: Murata Manufacturing Co., Ltd., Nagaokakyo-shi, Kyoto-fu (JP)

(72) Inventors: Takayuki Tange, Nagaokakyo (JP); Yasuhiro Higashide, Nagaokakyo (JP); Takeshi Wake, Nagaokakyo (JP); Munetake Miyashita, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/143,509

(22) Filed: Sep. 27, 2018

(65) Prior Publication Data
US 2019/0037700 A1    Jan. 31, 2019

Related U.S. Application Data

(63) Continuation of application No. PCT/JP2017/011582, filed on Mar. 23, 2017.

(30) Foreign Application Priority Data

Apr. 21, 2016  (JP) ................................. 2016-084990

(51) Int. Cl.
*H05K 1/18* (2006.01)
*H02M 3/158* (2006.01)
(Continued)

(52) U.S. Cl.
CPC ............ *H05K 1/182* (2013.01); *H02M 3/155* (2013.01); *H02M 3/158* (2013.01); *H05K 1/11* (2013.01);
(Continued)

(58) Field of Classification Search
CPC ............................... H05K 1/182; H02M 3/158
See application file for complete search history.

(56) References Cited

U.S. PATENT DOCUMENTS

| 2012/0063038 A1 | 3/2012 | Yin et al. |
| 2012/0320536 A1 | 12/2012 | Yamamoto |

(Continued)

FOREIGN PATENT DOCUMENTS

| CN | 102447382 A | 5/2012 |
| CN | 105099193 A | 11/2015 |

(Continued)

OTHER PUBLICATIONS

Official Communication issued in International Patent Application No. PCT/JP2017/011582, dated Apr. 25, 2017.

*Primary Examiner* — William H. Mayo, III
*Assistant Examiner* — Hiram E Gonzalez
(74) *Attorney, Agent, or Firm* — Keating & Bennett, LLP

(57) ABSTRACT

A power supply module includes first and second outer surfaces that are adjacent to and perpendicular or substantially perpendicular to each other. The power supply module includes a substrate that includes a first surface and a side surface, electronic components mounted at least on the first surface, a first resin material provided on the first surface, and terminal electrodes exposed at least at the first outer surface. The first resin member seals the electronic components mounted on the first surface. In the substrate, the first surface is perpendicular or substantially perpendicular to the first outer surface, which extends at least across the side surface of the substrate and the first resin member. The area of the first outer surface is smaller than the area of the second outer surface.

20 Claims, 10 Drawing Sheets

(51) Int. Cl.
*H05K 1/11* (2006.01)
*H05K 7/14* (2006.01)
*H02M 3/155* (2006.01)
*H05K 7/02* (2006.01)
*H05K 5/06* (2006.01)

(52) U.S. Cl.
CPC ............... *H05K 5/065* (2013.01); *H05K 7/02* (2013.01); *H05K 7/1432* (2013.01); *H05K 2201/1003* (2013.01); *H05K 2201/10015* (2013.01); *H05K 2201/10166* (2013.01); *H05K 2201/10522* (2013.01); *H05K 2201/10545* (2013.01)

(56) References Cited

U.S. PATENT DOCUMENTS

| | | | |
|---|---|---|---|
| 2013/0049730 A1* | 2/2013 | Kato | H01L 23/642 323/355 |
| 2015/0280571 A1* | 10/2015 | Tateno | H02M 1/38 323/271 |
| 2015/0303814 A1 | 10/2015 | Li et al. | |

FOREIGN PATENT DOCUMENTS

| | | | |
|---|---|---|---|
| JP | 06-66291 U | | 9/1994 |
| JP | 2004-289912 A | | 10/2004 |
| JP | 2004289912 A | * | 10/2004 |
| JP | 2010-287684 A | | 12/2010 |
| JP | 2013-046509 A | | 3/2013 |
| WO | 2011/129161 A1 | | 10/2011 |

\* cited by examiner

POWER SUPPLY MODULE AND POWER SUPPLY DEVICE

CROSS REFERENCE TO RELATED APPLICATIONS

This application claims the benefit of priority to Japanese Patent Application No. 2016-084990 filed on Apr. 21, 2016 and is a Continuation Application of PCT Application No. PCT/JP2017/011582 filed on Mar. 23, 2017. The entire contents of each application are hereby incorporated herein by reference.

BACKGROUND OF THE INVENTION

1. Field of the Invention

The present invention relates to a power supply module, and more particularly to a power supply module that includes a substrate and a plurality of electronic components mounted on the substrate, and a power supply device that includes the power supply module and a mounting substrate.

2. Description of the Related Art

In the related art, a DC-DC converter module is known that has a structure in which an electronic component, such as an IC chip, is directly mounted on the top surface of a chip inductor (Japanese Unexamined Patent Application Publication No. 2010-287684).

In the above-mentioned DC-DC converter module, a plurality of electronic components are mounted on the top surface of a chip inductor, and thus, a reduction in the size of the DC-DC converter module is achieved.

However, with the recent reduction in the sizes of electronic devices, there has been a demand for high densification and high integration of discrete components, package modules, and the like that are mounted on mounting substrates, and the module having the structure described in Japanese Unexamined Patent Application Publication No. 2010-287684 has a problem in that the footprint is large.

SUMMARY OF THE INVENTION

Preferred embodiments of the present invention provide power supply modules that are each capable of further reducing a footprint by using a simple configuration and power supply devices that each include a power supply module and a mounting substrate.

A power supply module according to a preferred embodiment of the present invention includes a first outer surface and a second outer surface that is adjacent to the first outer surface and perpendicular or substantially perpendicular to the first outer surface, a substrate that includes a first surface and a side surface, a plurality of electronic components that are mounted at least on the first surface, a first resin member that is provided on the first surface and that seals the electronic components mounted on the first surface, and a terminal electrode that is exposed at least at the first outer surface. In the substrate, the first surface is perpendicular or substantially perpendicular to the first outer surface. The first outer surface extends at least across the side surface of the substrate and the first resin member. An area of the first outer surface is smaller than an area of the second outer surface.

With this configuration, a power supply module having a smaller footprint than that in the case in which the second outer surface defines and functions as a mounting surface (i.e., the case in which the first surface of the substrate is parallel or substantially parallel to the mounting surface) is obtained.

In addition, in this configuration, the plurality of electronic components mounted on the first surface of the substrate 1 are sealed by the first resin member. In other words, the thickness of the first resin member is equal to or greater than a thickness required to seal the plurality of electronic components mounted on the first surface. That is to say, the area of the first outer surface required for stable mounting is ensured. Therefore, with this configuration, a power supply module that is able to be stably mounted while having a small footprint is obtained.

In a power supply module according to a preferred embodiment of the present invention, it is preferable that the substrate further includes a second surface that is opposite to the first surface and perpendicular or substantially perpendicular to the first outer surface and that some of the plurality of electronic components are mounted on the second surface. In addition, it is preferable that the power supply module further includes a second resin member that is provided on the second surface and that seals the electronic components mounted on the second surface and that the first outer surface further includes the second resin member. With this configuration, a power supply module that is smaller in size than that in the case in which the plurality of electronic components are mounted on one of the first surface and the second surface of the substrate is obtained.

In a power supply module according to a preferred embodiment of the present invention, it is preferable that the power supply module further includes an inductor that is mounted on the first surface or the second surface and sealed by the first resin member or the second resin member and that some of the plurality of electronic components are disposed at positions at which the some of the plurality of electronic components overlap the inductor when the first surface or the second surface is viewed in plan view. In the power supply module, the inductor is a component having a relatively large size. Therefore, with this configuration, the power supply module is able to be easily reduced in size.

In a power supply module according to a preferred embodiment of the present invention, the plurality of electronic components may include an input capacitor that is connected to an input portion, an output capacitor that is connected to an output portion, and a switching element that is connected between the inductor and the input capacitor or between the inductor and the output capacitor, and that switches on and off a current that flows through the inductor, and the input capacitor and the output capacitor may be mounted on one of the first surface and the second surface. In addition, the switching element may be mounted on one of the first surface and the second surface, the one surface being different from the other surface on which the input capacitor and the output capacitor are mounted.

In a power supply module according to a preferred embodiment of the present invention, the plurality of electronic components may include an input capacitor that is connected to an input portion, an output capacitor that is connected to an output portion, and at least one switching element that is connected between the inductor and the input capacitor and between the inductor and the output capacitor, and that switches on and off a current that flows through the inductor, and the input capacitor and the output capacitor may be mounted on one of the first surface and the second surface. In addition, the switching element may be mounted on one of the first surface and the second surface, the one surface being different from the other surface on which the input capacitor and the output capacitor are mounted.

In a power supply module according to a preferred embodiment of the present invention, it is preferable that the switching element is disposed at a position at which at least a portion of the switching element overlaps at least one of the input capacitor and the output capacitor when the first surface or the second surface is viewed in plan view. With this configuration, the distance between the switching element and the input capacitor or the output capacitor on a plane is shorter than that in the case in which the switching element and the capacitor are arranged on the same surface of the substrate, and thus, the length of a wiring line between the switching element and the input capacitor or the output capacitor is short. Thus, the inductance and the conductor resistance of a loop of the power supply module are reduced, and an effect of reducing or preventing switching noise, the effect being obtained by the input capacitor and the output capacitor is improved. Therefore, conducted noise from the power supply module to, for example, a conductor pattern provided in or on the substrate is reduced. In addition, radiation noise from the power supply module to the outside is reduced. Furthermore, with this configuration, the power conversion efficiency of the power supply module is improved.

In a power supply module according to a preferred embodiment of the present invention, it is preferable that the power supply module further includes a conductor that is provided in or on the substrate and that the switching element be disposed at a position at which at least a portion of the switching element overlaps the conductor when the first surface or the second surface is viewed in plan view. In this configuration, the conductor provided in or on the substrate defines and functions as a shield that blocks noise emitted from the switching element, and thus, noise that is emitted from the power supply module is reduced or prevented.

In a power supply module according to a preferred embodiment of the present invention, it is preferable that the terminal electrode extends from a portion of the first outer surface to a portion of the second outer surface. In this configuration, not only the first outer surface but also the second outer surface is able to be used as the mounting surfaces, and thus, a power supply module including mounting surfaces that are selectable in accordance with the space of a target on which the power supply module is to be mounted is achieved.

In a power supply module according to a preferred embodiment of the present invention, a plurality of the terminal electrodes may be provided, and the plurality of terminal electrodes may be arranged in a first direction along a ridge of the first outer surface and the second outer surface.

A power supply device according to a preferred embodiment of the present invention includes a mounting substrate and a plurality of power supply modules each of which includes a first outer surface and a second outer surface that is adjacent to the first outer surface and perpendicular or substantially perpendicular to the first outer surface. Each of the plurality of power supply modules includes a substrate that includes a first surface and a second surface, a plurality of electronic components that are mounted at least on the first surface, a first resin member that is provided on the first surface and that seals the electronic components mounted on the first surface, and a terminal electrode that is exposed at least at the first outer surface. In the substrate, the first surface is perpendicular or substantially perpendicular to the first outer surface. The first outer surface extends at least across the side surface of the substrate and the first resin member. An area of the first outer surface is smaller than an area of the second outer surface. The plurality of power supply modules are arranged in a second direction that is perpendicular or substantially perpendicular to a first direction along a ridge of the first outer surface and the second outer surface and are electrically connected in parallel to each other.

With this configuration, the length of a wiring line (a conductor pattern having high conductor resistance) connecting a plurality of power supply modules to each other is shorter than that in the case in which a power supply module having a structure in which a substrate thereof includes a first surface and a second surface that are parallel or substantially parallel to a mounting surface is mounted onto the mounting substrate, and thus, a low-loss power supply device is achieved. In addition, with this configuration, a plurality of power supply modules are able to be connected in parallel to each other by simple wiring. Therefore, it is not necessary to route a complex wiring line to connect a plurality of power supply modules in parallel to each other, and the plurality of power supply modules are easily connected to each other.

With this configuration, a plurality of power supply modules are able to be connected in parallel to each other at the shortest distance, and thus, unstable operation of the power supply device due to exogenous noise is reduced or prevented. In addition, by connecting the plurality of power supply modules in parallel to each other at the shortest distance, variations in load current between the power supply modules 101 due to a difference in the wiring length is able to be reduced, and the operational stability of the power supply device is improved.

In a power supply device according to a preferred embodiment of the present invention, the plurality of power supply modules may be mounted on the mounting substrate using solder.

According to preferred embodiments of the present invention, power supply modules each capable of further reducing a footprint by using a simple configuration and power supply devices that each includes the power supply module and a mounting substrate are obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
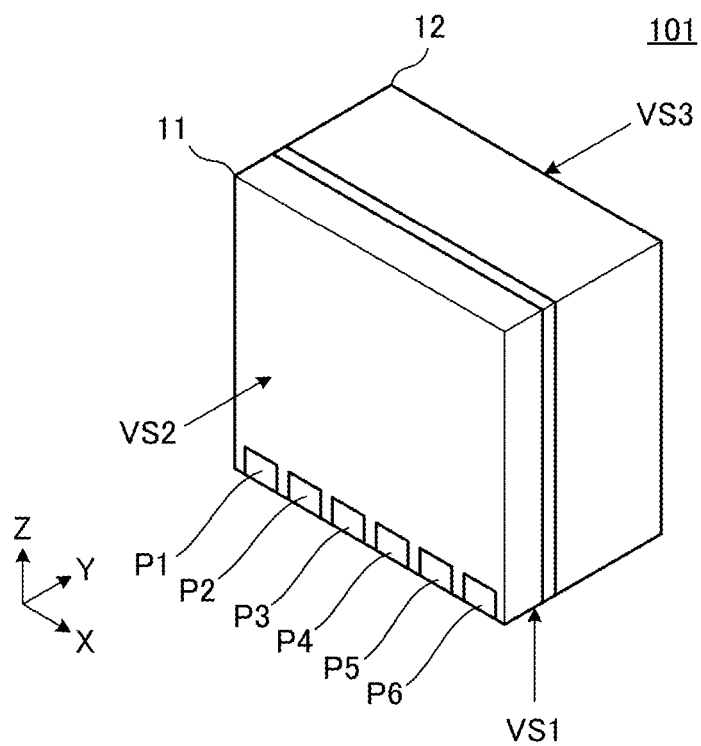
FIG. 1A is a perspective view of a power supply module 101 according to a first preferred embodiment of the present invention.

A plurality of preferred embodiments of the present invention will be described below with reference to the drawings. The same members illustrated in the drawings are denoted by the same reference signs. Although the preferred embodiments will be separately described for ease of explaining and understanding the gist of the present invention, the configurations described in the different preferred embodiments may be partially replaced with one another or may be combined with one another. In a second preferred embodiment and the subsequent preferred embodiments, descriptions of matters that are common to a first preferred embodiment will be omitted, and only differences will be described. In particular, similar advantageous effects obtained with similar configurations will not be described in every preferred embodiment.

First Preferred Embodiment

Figure 1B:
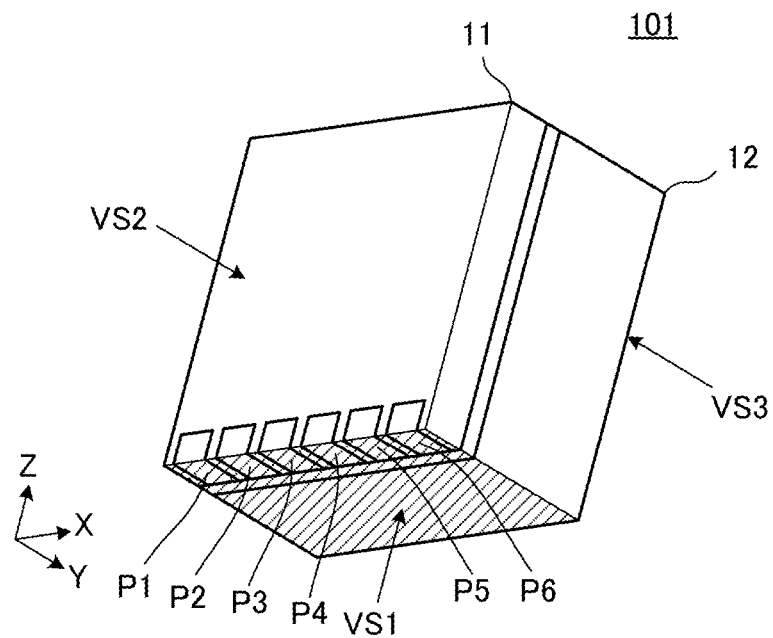
FIG. 1B is a perspective view of the power supply module 101 when viewed from a direction different from that of FIG. 1A.
Figure 2A:
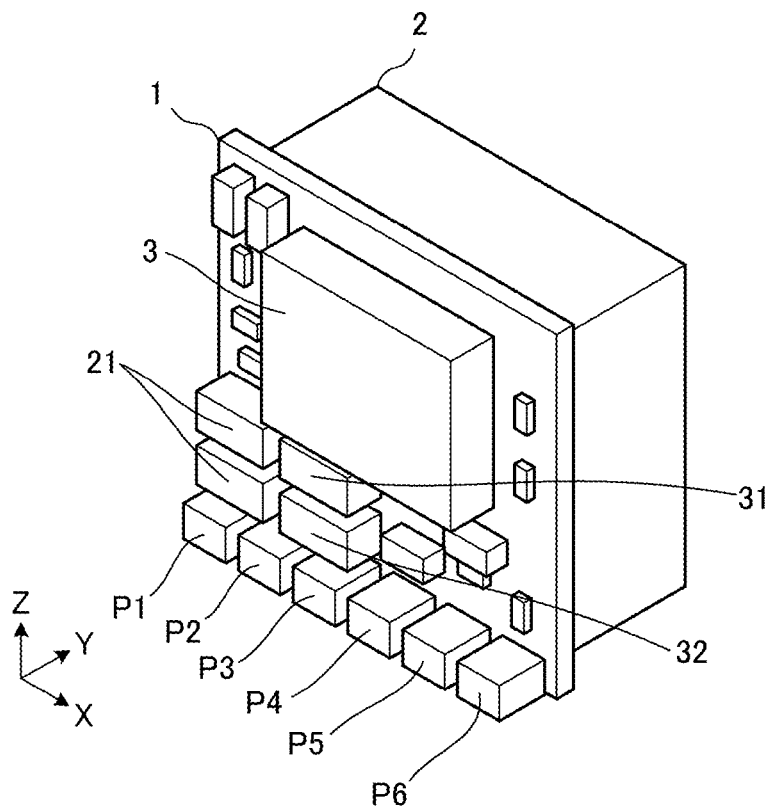
FIG. 2A is a perspective view illustrating an internal structure of the power supply module 101.
Figure 2B:
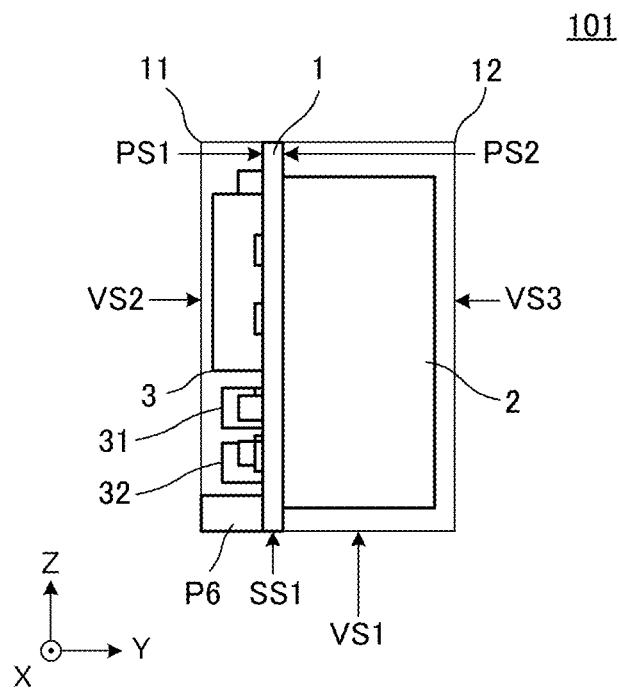
FIG. 2B is a front view of the power supply module 101.
Figure 3A:
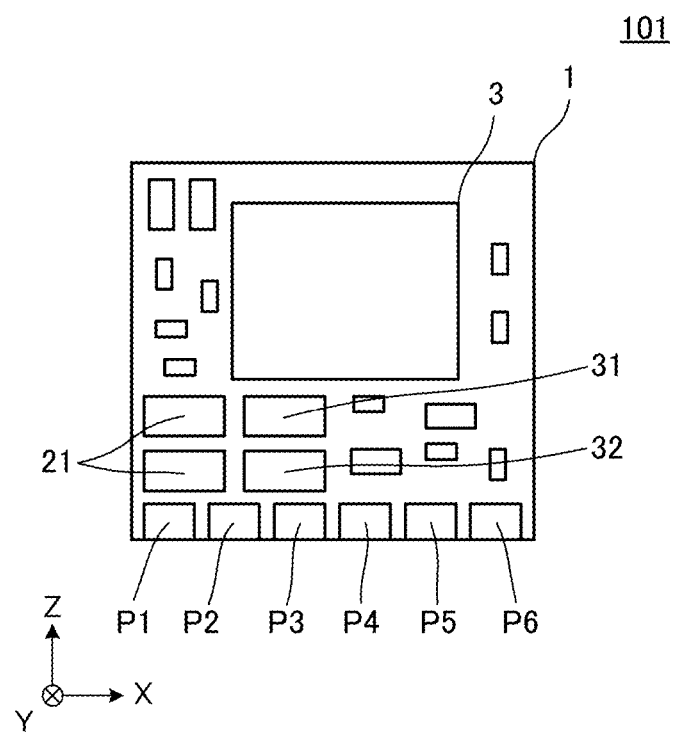
FIG. 3A is a left-hand side view of the power supply module 101.
Figure 3B:
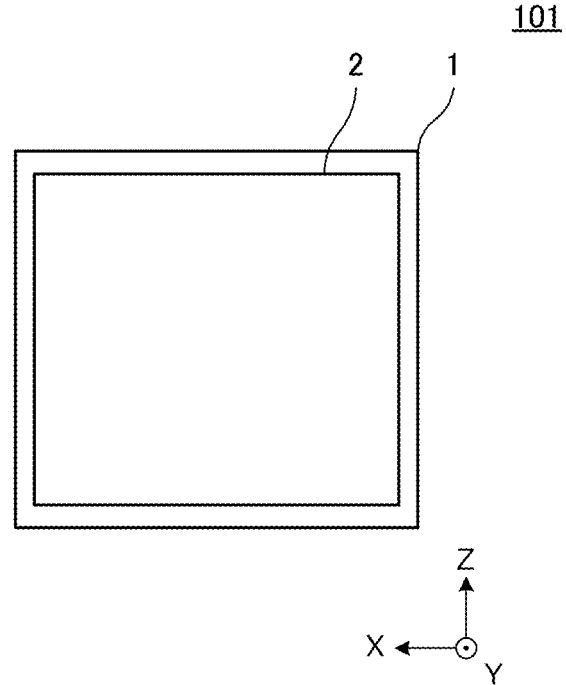
FIG. 3B is a right-hand side view of the power supply module 101.

FIG. 1A is a perspective view of a power supply module 101 according to the first preferred embodiment of the present invention, and FIG. 1B is a perspective view of the power supply module 101 when viewed from a different direction from that of FIG. 1A. FIG. 2A is a perspective view illustrating an internal structure of the power supply module 101, and FIG. 2B is a front view of the power supply module 101. FIG. 3A is a left-hand side view of the power supply module 101, and FIG. 3B is a right-hand side view of the power supply module 101.

In FIG. 1B, for ease of understanding the structure, a first outer surface VS1 is illustrated by hatching. In FIG. 2A, for ease of understanding the structure, a first resin member 11 and a second resin member 12 are not illustrated. In addition, in FIG. 2B, FIGS. 3A and 3B, for ease of understanding the structure, the first resin member 11 and the second resin member 12 are illustrated as being transparent.

In the present preferred embodiment, a case in which the power supply module 101 is a step-down DC-DC converter module will be described. The power supply module 101 has a rectangular or substantially rectangular parallelepiped shape and includes the first outer surface VS1 that is parallel or substantially parallel to an X-axis direction and a Y-axis direction, a second outer surface VS2, and a third outer surface VS3. In the present preferred embodiment, the first outer surface VS1 is a mounting surface of the power supply module 101. The second outer surface VS2 and the third outer surface VS3 are adjacent to the first outer surface VS1 and are perpendicular or substantially perpendicular to the first outer surface VS1.

Note that, in the present specification, the wording "a surface A and a surface B are perpendicular or substantially perpendicular to each other" is not limited to the case in which the surface A and the surface B intersect each other exactly at 90 degrees and includes the case in which the surface A and the surface B are substantially perpendicular to each other in consideration of design and manufacturing tolerances and other factors. This is common to the subsequent preferred embodiments.

The power supply module 101 includes a substrate 1, an inductor 2, a control IC 3, two capacitors 21, switching elements 31 and 32, the first resin member 11, the second resin member 12, and six terminal electrodes P1, P2, P3, P4, P5, and P6.

The substrate 1 is preferably a flat plate having a rectangular or substantially rectangular shape in plan view and including a first surface PS1, a second surface PS2 facing the first surface PS1, and a side surface SS1. The first surface PS1 and the second surface PS2 of the substrate 1 are surfaces that are parallel or substantially parallel to in the X-axis direction and the Z-axis direction. The side surface SS1 is adjacent to the first surface PS1 and the second surface PS2 and is perpendicular or substantially perpendicular to the first surface PS1 and the second surface PS2. As illustrated in FIG. 2B, the first surface PS1 and the second surface PS2 of the substrate 1 are perpendicular or substantially perpendicular to the first outer surface VS1 and parallel or substantially parallel to the second outer surface VS2 and the third outer surface VS3. The substrate 1 is preferably a printed wiring board including, for example, a thermosetting resin, such as an epoxy resin.

The control IC 3, the two capacitors 21, and the switching elements 31 and 32 are installed (mounted) on the first surface PS1 of the substrate 1, and the inductor 2 is installed (mounted) on the second surface PS2 of the substrate 1. The control IC 3 is preferably, for example, a microprocessor chip or an IC chip. The two capacitors 21 are an input capacitor and an output capacitor and are preferably, for example, ceramic chip capacitors. The switching elements 31 and 32 are preferably, for example, FETs. The inductor 2 is preferably, for example, a chip inductor. The control IC 3, the two capacitors 21, and the switching elements 31 and 32 are mounted on the first surface PS1 of the substrate 1 using, for example, an electrically conductive bonding material, such as solder.

In the present preferred embodiment, the control IC 3, the two capacitors 21, the switching elements 31 and 32, and other components correspond to "a plurality of electronic components that are mounted on the first surface".

As illustrated in FIG. 3B, the inductor 2 is mounted over the entire or substantially the entire second surface PS2 of the substrate 1. Thus, each of the plurality of electronic components (the control IC 3, the capacitors 21, the switching elements 31 and 32, and other components) are disposed at a position at which the electronic component overlaps the inductor 2 when the first surface PS1 or the second surface PS2 is viewed in plan view (viewed in the Y-axis direction). The inductor 2 is mounted on the second surface PS2 of the substrate 1 using, for example, an electrically conductive bonding material, such as solder.

The first resin member 11 is provided on the first surface PS1 of the substrate 1 and is a resin block that has a rectangular or substantially rectangular parallelepiped shape and that seals the control IC 3, the two capacitors 21 (corresponding to "an input capacitor" and "an output capacitor"), and the switching elements 31 and 32, which are mounted on the first surface PS1. In other words, the control IC 3, the two capacitors 21, and the switching elements 31 and 32 are buried in the first resin member 11 provided on the first surface PS1 of the substrate 1. The first resin member 11 is preferably made of, for example, a thermosetting resin, such as an epoxy resin.

The second resin member 12 is provided on the second surface PS2 of the substrate 1 and is a resin block that has a rectangular or substantially rectangular parallelepiped shape and that seals the inductor 2, which is mounted on the second surface PS2. In other words, the inductor 2 is buried in the second resin member 12 provided on the second surface PS2 of the substrate 1. The second resin member 12 is preferably made of, for example, a thermosetting resin, such as an epoxy resin.

As illustrated in FIG. 1A and FIG. 2B, the first outer surface VS1 of the power supply module 101 extends across the side surface SS1 of the substrate 1, the first resin member 11, and the second resin member 12. The second outer surface VS2 of the power supply module 101 is provided at the first resin member 11. As illustrated in FIG. 1B, the area of the first outer surface VS1 is smaller than the area of the second outer surface VS2.

The power supply module 101 according to the present preferred embodiment has a structure in which the plurality of electronic components, which are mounted on the first surface PS1 of the substrate 1, are sealed by the first resin member 11. In other words, the thickness of the first resin member 11 (the thickness of the first resin member 11 in a direction (the Y-axis direction) perpendicular or substantially perpendicular to the first surface PS1 of the substrate 1) is equal to or greater than a thickness required to seal the plurality of electronic components mounted on the first surface PS1. In addition, the power supply module 101 has a structure in which the inductor 2, which is mounted on the second surface PS2 of the substrate 1, is sealed by the second resin member 12. In other words, the thickness of the second resin member 12 (the thickness of the second resin member 12 in the Y-axis direction) is equal to or greater than a thickness required to seal the inductor 2 mounted on the second surface PS2.

Thus, the width of the power supply module (the dimension of the power supply module in the Y-axis direction) is equal to or greater than a width required for the above-described structures. That is to say, the area of the first outer surface VS1 required for stable mounting of the power supply module is ensured.

The terminal electrodes P1, P2, P3, P4, P5, and P6 are columnar electrodes connected to outer electrodes and are each buried in the first resin member 11 such that at least a portion thereof is exposed at the first outer surface VS1. Each of the terminal electrodes P1, P2, P3, P4, P5, and P6 is mounted on the first surface PS1 of the substrate 1 and is connected to a conductor pattern or other suitable structure provided in or on the substrate 1. In the present preferred embodiment, the terminal electrodes P1, P2, P3, P4, P5, and P6 are located on a first side of the substrate 1 (a lower side) of the substrate 1 in FIG. 3A and are exposed at the first outer surface VS1 and the second outer surface VS2. As illustrated in FIG. 1B, the terminal electrodes P1, P2, P3, P4, P5, and P6 extend from a portion of the first outer surface VS1 to a portion of the second outer surface VS2 and are arranged in a first direction (the X-axis direction) along the ridge of the first outer surface VS1 and the second outer surface VS2. Each of the terminal electrodes P1, P2, P3, P4, P5, and P6 is preferably, for example, a block that is made of copper and that has a rectangular or substantially rectangular parallelepiped shape.

Figure 4:
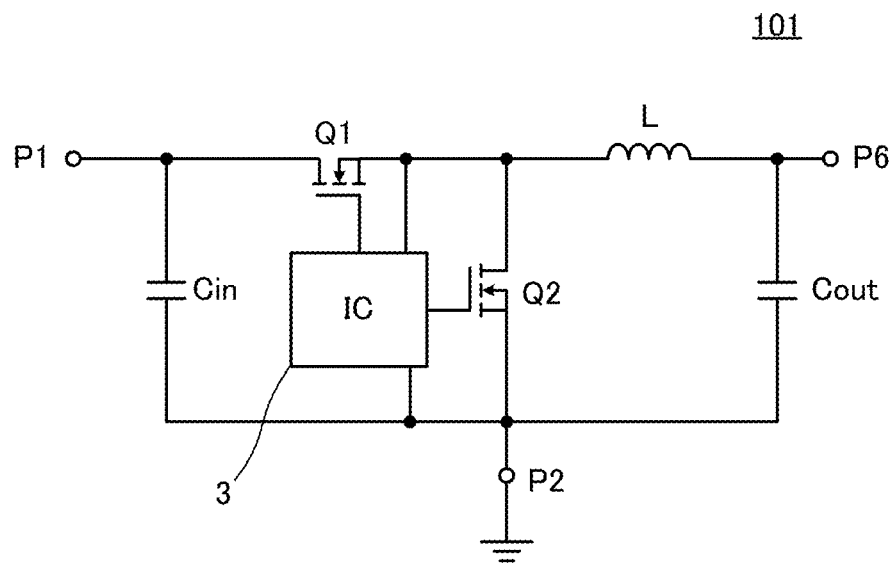
FIG. 4 is a circuit diagram of the power supply module 101.

FIG. 4 is a circuit diagram of the power supply module 101. In FIG. 4, the inductor 2, the two capacitors 21, and the switching elements 31 and 32, which are illustrated in FIGS. 3A and 3B, are respectively represented by an inductor L, an input capacitor Cin, an output capacitor Cout, and switching elements Q1 and Q2. In FIG. 4, the terminal electrode P1 is a voltage-input portion that receives a DC voltage, and the terminal electrode P2 is a ground. The terminal electrode P6 is a voltage-output portion.

The inductor L and the switching element Q1 are connected between the terminal electrode P1 and the terminal electrode P6. The switching elements Q1 and Q2 switch on and off a current that flows through the inductor L. The switching element Q1 is connected between the terminal electrode P1 and the inductor L, and the switching element Q2 is connected between the terminal electrode P2 (the ground) and the inductor L. The input capacitor Cin is connected between the terminal electrode P1 and the terminal electrode P2 (the ground), and the output capacitor Cout is connected between the terminal electrode P6 and the ground. The control IC 3 is connected between the switching elements Q1 and Q2.

More specifically, a drain of the switching element Q1 is connected to the terminal electrode P1, and a source of the switching element Q1 is connected to a first end of the inductor L. A second end of the inductor L is connected to the terminal electrode P6. A drain of the switching element Q2 is connected to the first end of the inductor L, and a source of the switching element Q2 is connected to the terminal electrode P2 (the ground). A first end of the input capacitor Cin is connected to the terminal electrode P1, and a second end of the input capacitor Cin is connected to the terminal electrode P2 (the ground). A first end of the output capacitor Cout is connected to the terminal electrode P6, and a second end of the output capacitor Cout is connected to the terminal electrode P2 (the ground). The control IC 3 is connected to the gate and the source of each of the switching elements Q1 and Q2.

As described above, the power supply module 101 defines a step-down DC-DC converter module.

The power supply module 101 according to the present preferred embodiment exhibits the following advantageous effects.

In the power supply module 101, the plurality of electronic components and the inductor 2 are mounted on the first surface PS1 and the second surface PS2 of the substrate 1 and in which the first surface PS1 and the second surface PS2 are perpendicular or substantially perpendicular to the first outer surface VS1, which is the mounting surface. In addition, in the power supply module 101, the area of the first outer surface VS1 is smaller than the area of the second outer surface VS2. With this configuration, a power supply module having a smaller footprint than that in the case in which the second outer surface VS2 defines and functions as the mounting surface (i.e., the case of a structure in which the first surface PS1 and the second surface PS2 of the substrate 1 are parallel or substantially parallel to the mounting surface) is obtained.

In the power supply module 101, the plurality of electronic components mounted on the first surface PS1 of the substrate 1 are sealed by the first resin member 11 and in which the inductor 2 mounted on the second surface PS2 is sealed by the second resin member 12. In other words, the thickness of the first resin member 11 in the Y-axis direction is equal to or greater than the thickness required to seal the plurality of electronic components mounted on the first surface PS1, and the thickness of the second resin member 12 in the Y-axis direction is equal to or greater than the thickness required to seal the inductor 2 mounted on the second surface PS2. That is to say, with this configuration, the area of the first outer surface VS1 required for stable mounting is ensured. Therefore, a power supply module that is able to be stably mounted while having a small footprint (even with the structure in which the first outer surface VS1 is perpendicular or substantially perpendicular to the first surface PS1 and the second surface PS2 of the substrate 1) is obtained.

In the structure according to the present preferred embodiment, the inductor is mounted on the second surface PS2 of the substrate 1, and the plurality of electronic components are mounted on the first surface PS1 of the substrate 1. Therefore, a power supply module that is smaller in size (particularly having smaller dimensions in the X-axis direction and the Z-axis direction) than that in the case in which the inductor and the plurality of electronic components are mounted on one of the first surface PS1 and the second surface PS2 of the substrate 1 is obtained.

In the present preferred embodiment, the terminal electrodes P1, P2, P3, P4, P5, and P6 extend from a portion of the first outer surface VS1 to a portion of the second outer surface VS2 and are exposed at the first outer surface VS1 and the second outer surface VS2. In this configuration, not only the first outer surface VS1 but also the second outer surface VS2 may be used as the mounting surface, and thus, a power supply module having mounting surfaces that are selectable in accordance with the space of a target on which the power supply module is to be mounted is obtained.

In the present preferred embodiment, each of the plurality of electronic components (the control IC 3, the capacitors 21, the switching elements 31 and 32, and other components) is disposed at the position at which the electronic component overlaps the inductor 2 when viewed in the Y-axis direction. In the power supply module, the inductor 2 is a component having a relatively large size. Thus, with this configuration, the power supply module is able to be easily reduced in size. Note that it is not necessary for all of the plurality of electronic components to overlap the inductor 2 when viewed in the Y-axis direction. As will be described later (see the second preferred embodiment), advantageous effects, such as those described above, are able to be obtained as long as some of the plurality of electronic components overlap the inductor 2 when viewed in the Y-axis direction.

In the present preferred embodiment, the electronic components (the control IC 3, the capacitors 21, and the switching elements 31 and 32) mounted on the first surface PS1 are sealed by the first resin member 11, and the inductor 2 mounted on the second surface is sealed by the second resin member 12. In this configuration, since the electronic components and the inductor 2 are protected with the resin members, the entire power supply module is sturdy, and the mechanical strength of the power supply module and the durability of the power supply module with respect to an external force and other forces are improved. In addition, with this configuration, the mounting strength of each of the electronic components with respect to the substrate 1 is further improved compared to the case in which the electronic components are mounted on the substrate 1 only by soldering, and the electrical connection reliability between the electronic components and the substrate is improved.

Furthermore, in this configuration, since the electronic components mounted on the substrate 1 are sealed by the resin material, an electronic component, a semiconductor bare chip component (IC), and other components each having low component strength are also able to be directly mounted on the substrate 1 by face-down mounting. Consequently, a lead frame and wire bonding are not necessary, and the size in the module is small. Therefore, by using such a bare chip component, reduction in the size of the power supply module is facilitated.

In the present preferred embodiment, the electronic components, such as the switching elements 31 and 32, the control IC 3, and other components that generate heat during operation (hereinafter referred to as heat generating components) are sealed by the resin material that has a thermal conductivity higher than that of air. Accordingly, the heat generated by each of the heat generating components is dispersed through the resin member, and thus, heat-dissipation performance is improved.

In the present preferred embodiment, the heat generating components (the switching elements 31 and 32 and other components) are mounted on the first surface PS1 and sealed by the first resin member 11 at which the mounting surface (the first outer surface VS1) of the power supply module is provided. When the power supply module having this configuration is mounted on a mounting substrate, gaps between the heat generating components and the mounting substrate are filled with the resin member such that the heat generating components are in contact with the mounting substrate via the resin member. Therefore, with this configuration, the heat generated by each of the heat generating components is more easily dispersed to the mounting substrate compared to the case in which a power supply module having a structure in which heat generating components are not sealed by a resin member is mounted on a mounting substrate, and the heat-dissipation performance is further improved.

In the case in which the power supply module has a structure in which the first surface PS1 and the second surface PS2 of the substrate 1 are not sealed by a resin member, it is necessary to ensure the strength of the substrate 1 in order to mount the electronic components, and thus, it is difficult to make the substrate 1 thin. In contrast, in the present preferred embodiment, since the first surface PS1 and the second surface PS2 of the substrate 1 are sealed by the resin members, even if the substrate 1 is made thin, the strength of the substrate 1 for mounting the electronic components is ensured, and the probability of warpage and other deformation or damage occurring in the substrate 1 is reduced. Therefore, with the present preferred embodiment, the substrate 1, which is made thin, is able to be easily used, so that a power supply module that is small in size (particularly having a small thickness in the Y-axis direction) is obtained.

Note that, by making the substrate 1 thin, the wiring length of an interlayer connection conductor that connects the first surface PS1 and the second surface PS2 of the substrate 1 to each other is shortened, so that the conductor resistance of the entire power supply module is reduced. Therefore, a low-loss power supply module is obtained.

Second Preferred Embodiment

In a second preferred embodiment of the present invention, a power supply module in which electronic components, in addition to the inductor, are mounted on the second surface PS2 of the substrate 1 will be described.

Figure 5:
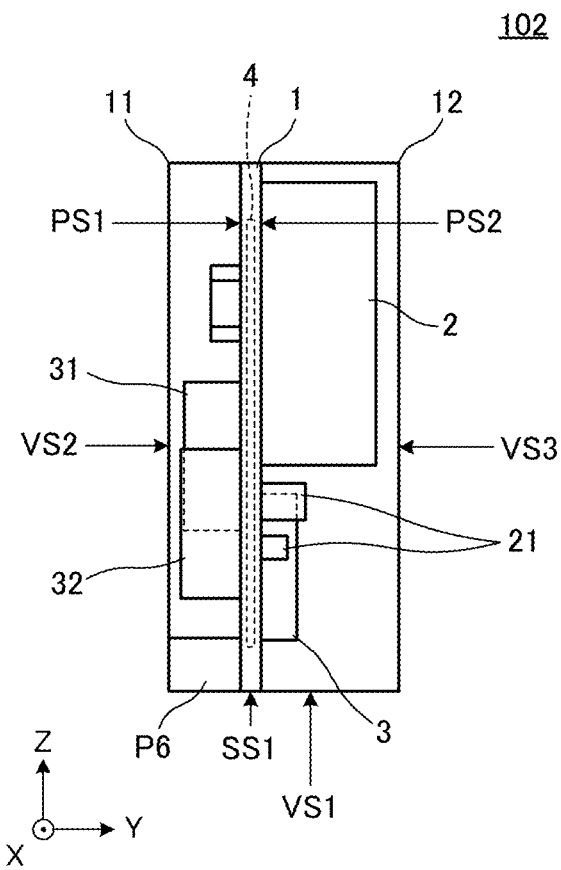
FIG. 5 is a front view of a power supply module 102 according to a second preferred embodiment of the present invention.
Figure 6A:
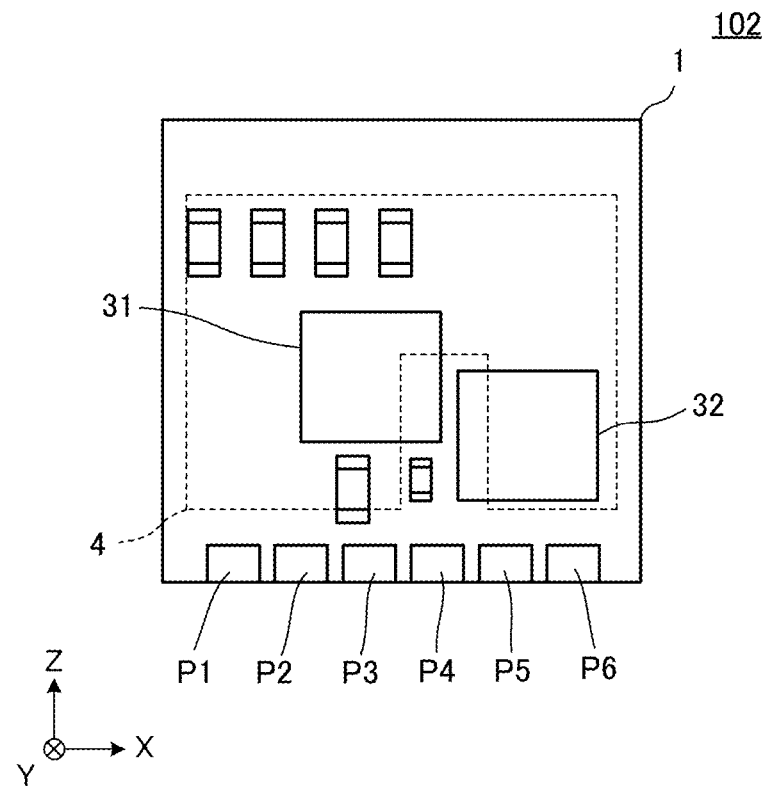
FIG. 6A is a left-hand side view of the power supply module 102.
Figure 6B:
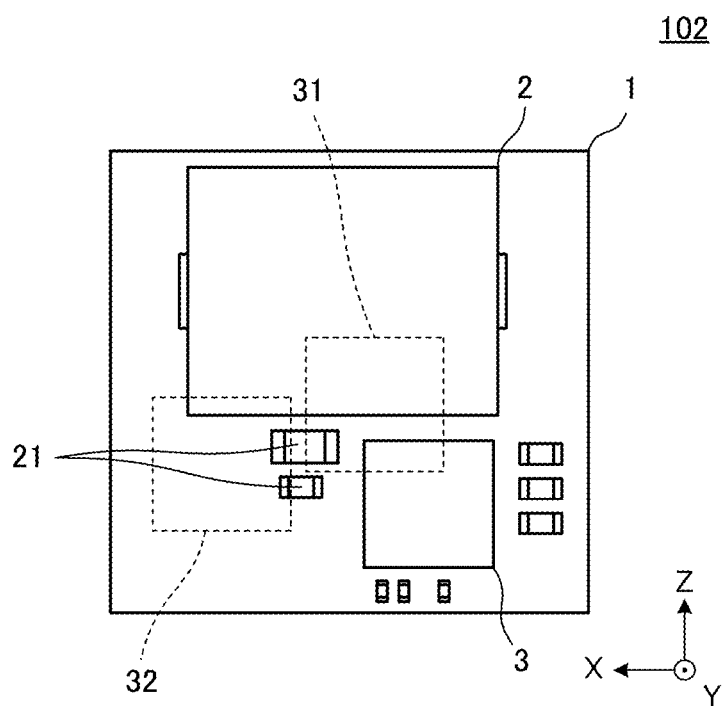
FIG. 6B is a right-hand side view of the power supply module 102.

FIG. 5 is a front view of a power supply module 102 according to the second preferred embodiment. FIG. 6A is a left-hand side view of the power supply module 102, and FIG. 6B is a right-hand side view of the power supply module 102. In FIGS. 5, 6A, and 6B, for ease of understanding of the structure of the power supply module 102, the first resin member 11 and the second resin member 12 are illustrated as being transparent. In addition, in FIG. 6B, the positions of the switching elements 31 and 32 are indicated by dashed lines for ease of understanding of the structure, and in FIG. 6A, the position of a conductor 4 is indicated by a dashed line for ease of understanding of the structure.

A difference between the power supply module 102 according to the present preferred embodiment and the power supply module 101 according to the first preferred embodiment is that some of the plurality of electronic components (the control IC 3 and the two capacitors 21) are mounted on the second surface PS2 of the substrate 1. Another difference between the power supply module 102 and the power supply module 102 is that the power supply module 102 includes the conductor 4 provided in the substrate 1. The rest of the configuration of the power supply module 102 is the same or substantially the same as that of the power supply module 101.

The conductor 4 is preferably a conductor pattern that is provided in the substrate 1 and that has a U-shape (a C-shape) in plan view. The conductor 4 is preferably, for example, a ground conductor that is provided in the substrate 1.

The control IC and the two capacitors 21 (the input capacitor and the output capacitor) are mounted on the second surface PS2 of the substrate 1 and are sealed by the second resin member 12 that is provided on the second surface PS2 of the substrate 1. In the present preferred embodiment, the switching elements 31 and 32 are mounted on one of the first surface PS1 and the second surface PS2, the one surface (the first surface PS1) being different from the other surface (the second surface PS2) on which the capacitors 21 (the input capacitor and the output capacitor) are mounted.

In the present preferred embodiment, the switching elements 31 and 32 and other components correspond to "a plurality of electronic components that are mounted on the first surface". In addition, in the present preferred embodiment, the control IC and the capacitors 21 (the input capacitor and the output capacitor) correspond to "a plurality of electronic components that are mounted on the second surface".

As illustrated in FIG. 6B, the switching elements 31 and 32 according to the present preferred embodiment are disposed at positions at which at least a portion of each of the switching elements 31 and 32 overlaps the capacitors 21 (at least one of the input capacitor and the output capacitor) when viewed in the Y-axis direction. In addition, as illustrated in FIG. 6A, the switching elements 31 and 32 are disposed at positions at which a portion of each of the switching elements 31 and 32 overlaps the conductor 4 when viewed in the Y-axis direction.

Figure 7:
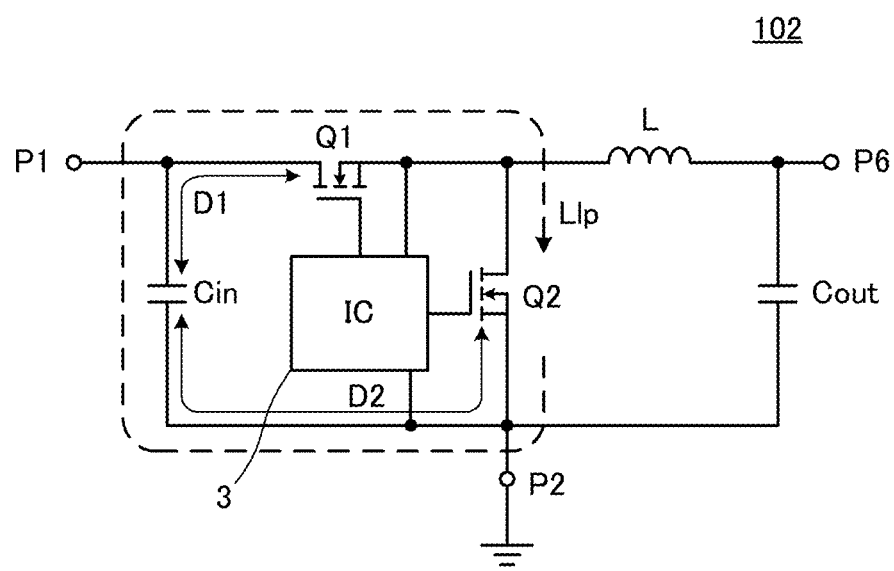
FIG. 7 is a circuit diagram of the power supply module 102.

FIG. 7 is a circuit diagram of the power supply module 102. As illustrated in FIG. 7, in the power supply module 102, the input capacitor Cin and the switching elements Q1 and Q2 define a loop L1$p$.

The power supply module 102 according to the present preferred embodiment exhibits the following advantageous effects in addition to the advantageous effects described in the first preferred embodiment.

In the present preferred embodiment, the switching elements 31 and 32 are disposed at the positions at which at least a portion of each of the switching elements 31 and 32 overlaps the capacitors 21 (at least one of the input capacitor and the output capacitor) when viewed in the Y-axis direction. With this configuration, the distance between each of the switching elements 31 and 32 and the input capacitor (or the output capacitor) on a plane (an XZ plane) is shorter than that in the case in which the switching elements 31 and 32 and the capacitors 21 are provided on the same surface of the substrate 1, and thus, the length of a wiring line between each of the switching elements 31 and 32 and the input capacitor (or the output capacitor) is short (specifically, the sections D1 and D2 in FIG. 7 are short). Thus, the inductance and the conductor resistance of the loop L1$p$ of the power supply module 102 are reduced, and an effect of reducing or preventing switching noise, the effect being obtained by the input capacitor (or the output capacitor), is improved. Therefore, conducted noise from the power supply module to, for example, a conductor pattern provided in or on the substrate 1 is reduced. In addition, radiation noise from the power supply module to the outside is reduced. Furthermore, with this configuration, the power conversion efficiency of the power supply module is improved. Note that, regarding the improvement in the power conversion efficiency of the power supply module, the effect increases particularly in an operation at high frequency.

In addition, by making the substrate 1 thin, the wiring length of the interlayer connection conductor or other conductors that connect the first surface PS1 and the second surface PS2 of the substrate 1 to each other is shortened, so that the conductor resistance is further reduced, and the power conversion efficiency of the power supply module is further improved.

In the present preferred embodiment, the switching elements 31 and 32 are disposed at the positions at which at least a portion of each of the switching elements 31 and 32 overlaps the conductor 4 when viewed in the Y-axis direction. In this configuration, the conductor 4, which is provided in the substrate 1, functions as a shield that blocks noise emitted from the switching elements 31 and 32, and thus, noise that is emitted from the power supply module is reduced or prevented. In the present preferred embodiment, particularly, noise that is emitted toward the third outer surface VS3 of the power supply module, which is opposite to the first surface PS1 of the substrate 1 on which the switching elements 31 and 32 are mounted, is reduced or prevented.

Note that, in the present preferred embodiment, although the case has been described in which the conductor 4 is provided in the substrate 1 and is a conductor pattern having a U-shape (a C-shape) in plan view, the present invention is not limited to this configuration. The conductor 4 may be provided on the first surface PS1 of the substrate 1 or may be provided on the second surface PS2 of the substrate 1. In addition, the shape of the conductor 4 in plan view may be suitably changed as long as the advantageous effects of preferred embodiments of the present invention are obtained and may be, for example, a square shape, a rectangular shape, a polygonal shape, a circular shape, an elliptical shape, an L-shape, a T-shape, or other suitable shape. Furthermore, the conductor 4 is not limited to a single conductor 4, and a plurality of conductors 4 may be provided in or on the substrate 1.

Note that, as described in the present preferred embodiment, some of the plurality of electronic components (the switching elements 31 and 32 and other components) are disposed at the positions at which they overlap with the inductor 2 when viewed in the Y-axis direction, so that the power supply module is able to be easily reduced in size.

In the present preferred embodiment, although the case has been described in which the switching elements 31 and 32 are mounted on the first surface PS1 of the substrate 1, the switching elements may be incorporated in a different electronic component, such as the control IC 3. In this case, it is preferable that the electronic component in which the switching elements are incorporated is disposed at a position at which the electronic component overlaps the capacitors 21 (at least one of the input capacitor and the output capacitor) when viewed in the Y-axis direction. In addition, in this case, it is preferable that the electronic component in which the switching elements are incorporated is disposed at a position at which the electronic component overlaps the conductor 4, which is provided in or on the substrate 1, when viewed in the Y-axis direction.

Third Preferred Embodiment

In a third preferred embodiment of the present invention, a power supply module in which a plurality of electronic components are mounted only on the first surface of the substrate will be described.

Figure 8A:
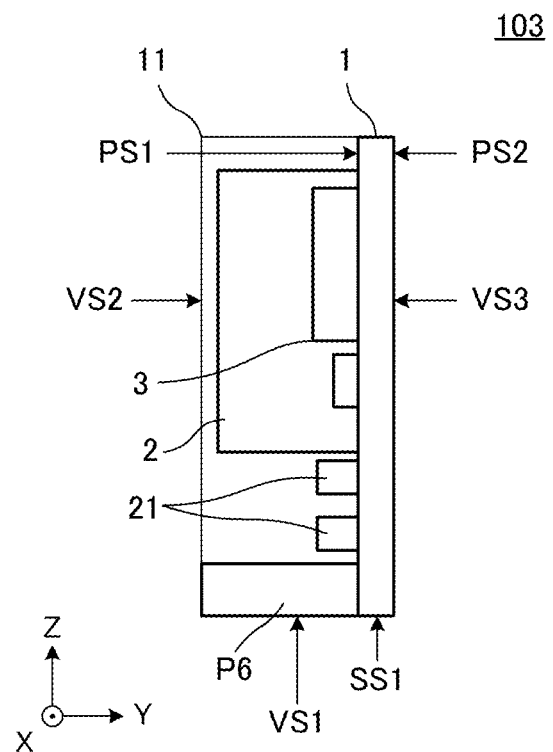
FIG. 8A is a front view of a power supply module 103 according to a third preferred embodiment of the present invention.
Figure 8B:
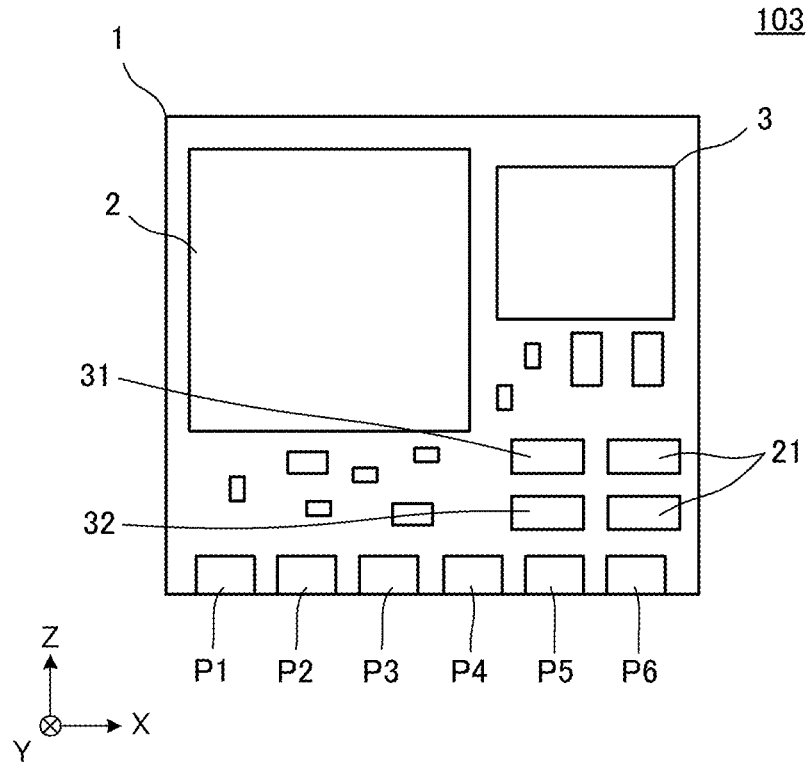
FIG. 8B is a left-hand side view of the power supply module 103.

FIG. 8A is a front view of a power supply module 103 according to the third preferred embodiment, and FIG. 8B is a left-hand side view of the power supply module 103. In FIGS. 8A and 8B, for ease of understanding of the structure of the power supply module 103, the first resin member 11 is illustrated as being transparent.

A difference between the power supply module 103 according to the present preferred embodiment and the power supply module 101 according to the first preferred embodiment is that all of the plurality of electronic components (the control IC 3, the capacitors 21, the switching elements 31 and 32, and other components) are mounted only on the first surface PS1 of the substrate 1. Another difference between the power supply module 103 and the power supply module 101 is that the second resin member is not provided on the second surface PS of the substrate 1. The rest of the configuration of the power supply module 103 is the same or substantially the same as that of the power supply module 101.

The inductor 2, the control IC 3, the capacitors 21 (the input capacitor and the output capacitor), and the switching elements 31 and 32 are mounted on the first surface PS1 of the substrate 1.

The inductor 2, the control IC 3, the capacitors 21 (the input capacitor and the output capacitor), and the switching elements 31 and 32 are buried in the first resin member 11, which is provided on the first surface PS1 of the substrate 1.

As illustrated in FIGS. 8A and 8B, the first outer surface VS1 of the power supply module 103 extends across the side surface SS1 of the substrate 1 and the first resin member 11. The second outer surface VS2 of the power supply module 103 is provided at the first resin member 11.

As described above, the configuration in which the inductor 2 and the plurality of electronic components (the control IC 3, the capacitors 21, the switching elements 31 and 32, and other components) are all mounted on the first surface PS1 of the substrate 1 and are sealed by the first resin member 11 is provided.

In each of the first and second preferred embodiments, although the case has been described in which the power supply module has the configuration in which the inductor 2 is mounted on the second surface PS2 of the substrate 1 and is sealed by the second resin member, the present invention is not limited to this configuration. As described in the present preferred embodiment, the inductor 2 may be mounted on the first surface PS1 of the substrate 1 and may be sealed by the first resin member 11.

Fourth Preferred Embodiment

In a fourth preferred embodiment of the present invention, a power supply module that is not a step-down DC-DC converter module will be described.

Figure 9A:
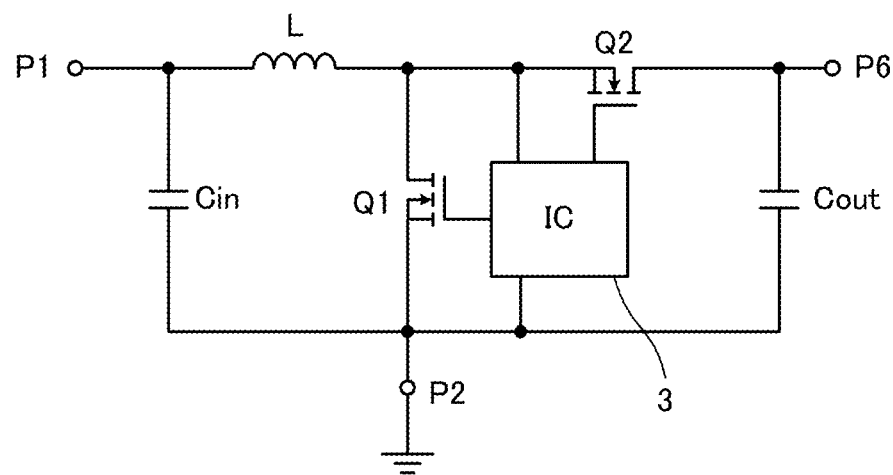
FIG. 9A is a circuit diagram of a power supply module 104A according to a fourth preferred embodiment.
Figure 9B:
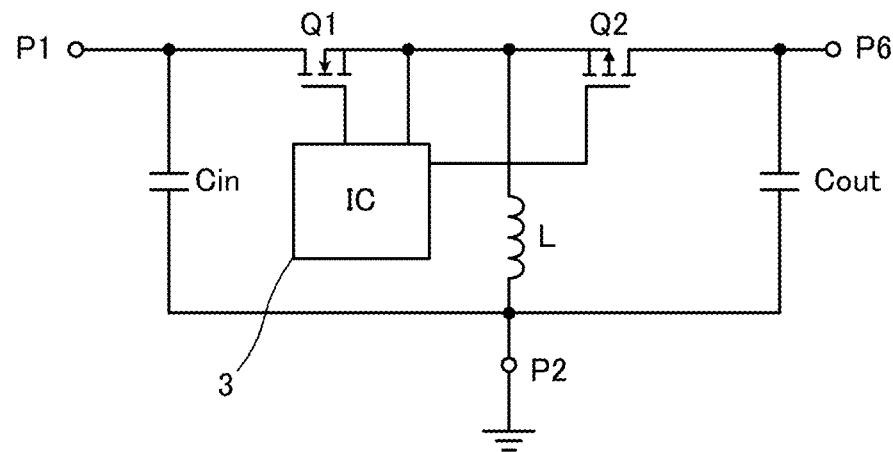
FIG. 9B is a circuit diagram of another power supply module 104B according to the fourth preferred embodiment of the present invention.

FIG. 9A is a circuit diagram of a power supply module 104A according to the fourth preferred embodiment, and FIG. 9B is a circuit diagram of another power supply module 104B according to the fourth preferred embodiment.

In the power supply module 104A, as illustrated in FIG. 9A, the inductor L and the switching element Q2 are connected between the terminal electrode P1 and the terminal electrode P6. The switching element Q2 is connected between the terminal electrode P6 and the inductor L, and the switching element Q1 is connected between the terminal electrode P2 (the ground) and the inductor L. The input capacitor Cin is connected between the terminal electrode P1 and the terminal electrode P2 (the ground), and the output capacitor Cout is connected between the terminal electrode P2 and the terminal electrode P2 (the ground). The control IC 3 is connected to the switching elements Q1 and Q2.

More specifically, the first end of the inductor L is connected to the terminal electrode P1, and the source of the switching element Q2 is connected to the second end of the inductor L. The drain of the switching element Q2 is connected to the terminal electrode P6. The drain of the switching element Q1 is connected to the second end of the inductor L, and the source of the switching element Q1 is connected to the terminal electrode P2 (the ground). The first end of the input capacitor Cin is connected to the terminal electrode P1, and the second end of the input capacitor Cin is connected to the terminal electrode P2 (the ground). The first end of the output capacitor Cout is connected to the terminal electrode P6, and the second end of the output capacitor Cout is connected to the terminal electrode P2 (the ground). The control IC 3 is connected to the gate and the source of each of the switching elements Q1 and Q2.

As described above, the power supply module 104A defines a step-up DC-DC converter module.

Next, in the power supply module 104B, as illustrated in FIG. 9B, the switching element Q1 and the switching element Q2 are connected between the terminal electrode P1 and the terminal electrode P6. The inductor L is connected between the switching elements Q1 and Q2 and the terminal electrode P2 (the ground).

More specifically, the drain of the switching element Q1 is connected to the terminal electrode P1, and the source of the switching element Q1 is connected to the first end of the inductor L. The drain of the switching element Q2 is connected to the first end of the inductor L. The second end of the inductor L is connected to the terminal electrode P2 (the ground), and the source of the switching element Q2 is connected to the terminal electrode P6. The control IC 3 is connected to the gate and the source of each of the switching elements Q1 and Q2.

As described above, the power supply module 104B defines a step-up and step-down DC-DC converter module.

As described in the present preferred embodiment, the power supply module according to preferred embodiments of the present invention may define not only a step-down DC-DC converter but also a step-up DC-DC converter and a step-up and step-down DC-DC converter module, for example. In addition, the power supply module according to preferred embodiments of the present invention is not limited to a DC-DC converter and may be an AC-DC converter module or a DC-AC converter module, for example.

Fifth Preferred Embodiment

In a fifth preferred embodiment of the present invention, a power supply device that includes three power supply modules 101 will be described.

Figure 10:
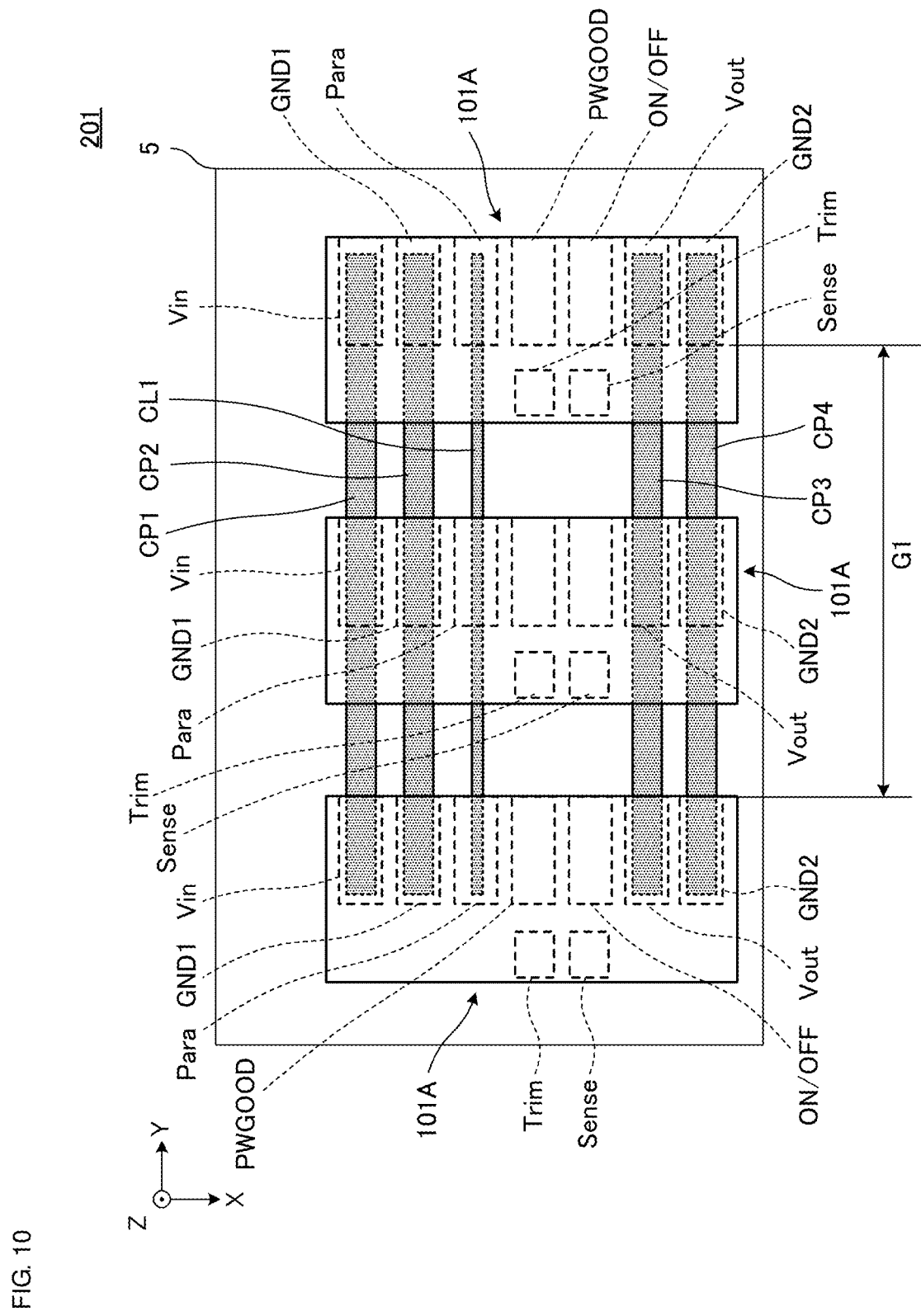
FIG. 10 is a plan view illustrating a principal portion of a power supply device 201 according to a fifth preferred embodiment that includes power supply modules according to a preferred embodiment of the present invention.

FIG. 10 is a plan view illustrating a principal portion of a power supply device 201 according to the fifth preferred embodiment that includes power supply modules according to at least one preferred embodiment of the present invention. In FIG. 10, for ease of understanding of the structure, terminal electrodes Vin, Vout, GND1, GND2, Para, ON/OFF, PWGOOD, Trim, and Sense are each indicated by a dashed line. In addition, in FIG. 10, for ease of understanding of the structure, conductor patterns CP1, CP2, CP3, CP4, and CL1 are each indicated by a dot pattern.

The power supply device 201 according to the present preferred embodiment includes a mounting substrate 5 and three power supply modules 101A. Each of the power supply modules 101A is the same or substantially the same as the power supply module 101 described in the first preferred embodiment. The difference between each of the power supply modules 101A and the power supply module 101 according to the first preferred embodiment is that the power supply module 101A includes the nine terminal electrodes Vin, Vout, GND1, GND2, Para, ON/OFF, PWGOOD, Trim, and Sense. The terminal electrodes Vin, GND1, Para, PWGOOD, ON/OFF, Vout, and GND2 are each provided in or on a portion of a first outer surface (a mounting surface) and are successively arranged in the first direction (the X-axis direction) along the ridge of the first outer surface and a second outer surface. The terminal electrodes Trim and Sense are provided in or on a portion of the first outer surface (the mounting surface) and are successively arranged in the first direction (the X-axis direction) along the ridge of the first outer surface and the second outer surface.

The five conductor patterns CP1, CP2, CP3, CP4, and CL1 are provided on the mounting substrate 5. The five conductor patterns CP1, CP2, CP3, CP4, and CL1 are provided on a surface of the mounting substrate 5. The five conductor patterns CP1, CP2, CP3, CP4, and CL1 are linear conductor patterns extending in the Y-axis direction and are arranged in the X-axis direction. The conductor patterns CP1, CP2, CP3, and CP4 are conductor patterns defining power supply wiring, and a large current flows therethrough. Consequently, the conductor patterns CP1, CP2, CP3, and CP4 each preferably have a line width larger than that of the conductor pattern CL1. The conductor pattern CL1 is a conductor pattern defining signal wiring.

The three power supply modules 101 are mounted on the mounting substrate 5. Each of the power supply modules 101 is mounted on the mounting substrate 5 using, for example, an electrically conductive bonding material, such as solder.

As illustrated in FIG. 10, the three power supply modules 101 are arranged in a second direction (the Y-axis direction) that is perpendicular or substantially perpendicular to the first direction (the X-axis direction) along the ridge of the first outer surface and the second outer surface and are electrically connected in parallel to one another.

More specifically, the terminal electrodes Vin of the three power supply modules 101 are connected in parallel to one another by the conductor pattern CP1, and the terminal electrodes GND1 of the three power supply modules 101 are connected in parallel to one another by the conductor pattern CP2. The terminal electrodes Vout of the three power supply modules 101 are connected in parallel to one another by the conductor pattern CP3, and the terminal electrodes GND2 of the three power supply modules 101 are connected in parallel to one another by the conductor pattern CP4. The terminal electrodes Para of the three power supply modules 101 are connected in parallel to one another by the conductor pattern CL1.

Figure 11:
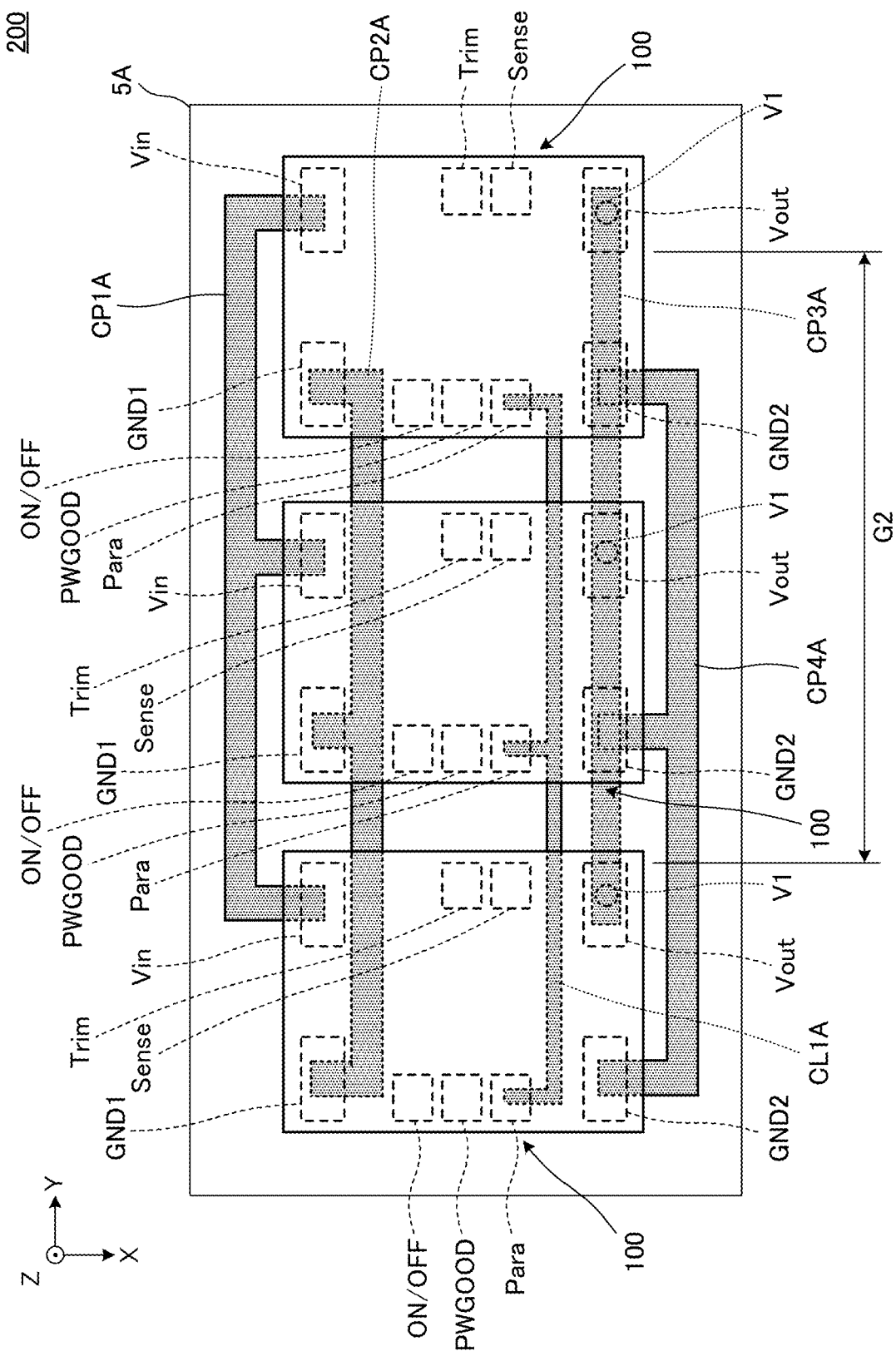
FIG. 11 is a plan view illustrating a principal portion of a power supply device 200 of a comparative example that includes power supply modules 100.

FIG. 11 is a plan view illustrating a principal portion of a power supply device 200 of a comparative example that includes power supply modules 100. In FIG. 11, for ease of understanding of the structure, the terminal electrodes Vin, Vout, GND1, GND2, Para, ON/OFF, PWGOOD, Trim, and Sense are each indicated by a dashed line. In addition, in FIG. 11, for ease of understanding of the structure, the conductor patterns CP1, CP2, CP3, CP4, and CL1 are each indicated by a dot pattern.

The power supply device 200 of the comparative example includes a mounting substrate 5A and the three power supply modules 100. Each of the power supply modules 100 includes a substrate including first and second surfaces on which a plurality of electronic components and an inductor are mounted, the first surface and the second surface being parallel or substantially parallel to a mounting surface. The nine terminal electrodes Vin, Vout, GND1, GND2, Para, ON/OFF, PWGOOD, Trim, and Sense of each of the power supply modules 100 are terminal electrodes that correspond to the nine terminal electrodes Vin, Vout, GND1, GND2, Para, ON/OFF, PWGOOD, Trim, and Sense of each of the power supply modules 101A.

The five conductor patterns CP1A, CP2A, CP3A, CP4A, and CL1A and three interlayer connection conductors V1 are provided in or on the mounting substrate 5A. The conductor patterns CP1A, CP2A, CP4A, and CL1A are provided on a surface of the mounting substrate 5A. The conductor patterns CP3A and the three interlayer connection conductors V1 are provided in the mounting substrate 5A. The conductor pattern CP3A is provided in the mounting substrate 3A due to the relationship with the other wiring lines and is routed to the surface of the mounting substrate 5A via the interlayer connection conductors V1.

The conductor patterns CP1A, CP2A, CP3A, CP4A, and CL1A are linear conductor patterns extending in the Y-axis direction and are arranged in the X-axis direction. As illustrated in FIG. 11, the three power supply modules 100 are mounted on the mounting substrate 5A so as to be arranged in the second direction (the Y-axis direction) and are electrically connected in parallel to one another.

More specifically, the terminal electrodes Vin of the three power supply modules 100 are connected in parallel to one another by the conductor pattern CP1A, and the terminal electrodes GND1 of the three power supply modules 100 are connected in parallel to one another by the conductor pattern CP2A. The terminal electrodes Vout of the three power supply modules 100 are connected in parallel to one another by the conductor pattern CP3A and the three interlayer connection conductors V1, and the terminal electrodes GND2 of the three power supply modules 100 are connected in parallel to one another by the conductor pattern CP4A.

The terminal electrodes Pa*n* of the three power supply modules 100 are connected in parallel to one another by the conductor pattern CL1A.

The power supply device 201 according to the present preferred embodiment exhibits the following advantageous effects.

In the power supply device 201 according to the present preferred embodiment, the three power supply modules 101 are arranged in the second direction (the Y-axis direction). Thus, the length of a wiring line (a conductor pattern having high conductor resistance) connecting a plurality of power supply modules to one another is shorter than that in the case in which a power supply module having a structure in which a substrate thereof includes a first surface and a second surface that are parallel or substantially parallel to a mounting surface is mounted on the mounting substrate (see a wiring distance G1 in FIG. 10 and a wiring distance G2 in FIG. 11). Therefore, compared to the case in which a power supply module having a structure in which a substrate thereof includes a first surface and a second surface that are parallel or substantially parallel to a mounting surface is mounted onto the mounting substrate, the lower-loss power supply device 201 is obtained.

In addition, in the power supply device 201 according to the present preferred embodiment, the plurality of power supply modules 101A are able to be connected in parallel to one another by the linear conductor patterns CP1, CP2, CP3, CP4, and CL1. In other words, in the present preferred embodiment, the plurality of power supply modules 101A are able to be connected in parallel to one another by simple wiring. Therefore, according to the present preferred embodiment, it is not necessary to route a complex wiring line (e.g., the conductor pattern CP3A illustrated in FIG. 11) to connect a plurality of power supply modules in parallel to one another, and the plurality of power supply modules are able to be easily connected to one another.

According to the present preferred embodiment, the plurality of power supply modules 101A are connected to one another by the conductor patterns CP1, CP2, CP3, CP4, and CL1, which linearly extend. In other words, the plurality of power supply modules 101A are able to be connected in parallel to one another at the shortest distance, and thus, the low-loss power supply device 201 is obtained. In addition, since the plurality of power supply modules are connected in parallel to one another at the shortest distance, unstable operation of the power supply device due to exogenous noise is reduced or prevented. Furthermore, by connecting the plurality of power supply modules in parallel to one another at the shortest distance, variations in load current between the power supply modules 101A due to a difference in the wiring length are able to be reduced, and the operational stability of the power supply device is improved.

In the power supply device 201 according to the present preferred embodiment, since the power supply modules 101A that are stably mountable are provided, the power supply modules 101A are able to be mounted on the mounting substrate 5 in a reflow process. Thus, the number of steps is less than that in a flow process, and the power supply modules 101A are able to be easily mounted on the mounting substrate 5. In addition, in each of the power supply modules 101A, the plurality of electronic components and the inductor are each sealed by the resin member (the first resin member or the second resin member), and thus, connecting portions, such as solder portions, each of which connects one of the plurality of electronic components (or the inductor) to the substrate 1 are protected even at high temperature during the reflow process. Furthermore, even in the case in which the connecting portions, such as solder portions, melt once at high temperature during the reflow process, the resin member (the first resin member or the second resin member) and the substrate 1 are joined to each other as a result of resins being bonded together, and the plurality of electronic components and the inductor do not detach or fall off. After cooling, the joining state of each of the connecting portions, such as solder portions, returns to normal.

Note that, in the present preferred embodiment, although the case has been described in which the power supply device 201 includes the three power supply modules 101A, the present invention is not limited to this configuration. The number of power supply modules may be suitably changed.

In each of the above-described preferred embodiments, although the case has been described in which the shape of the substrate 1 in plan view is a rectangular or substantially rectangular shape, the present invention is not limited to this configuration. The shape of the substrate 1 in plan view may be suitably changed as long as the advantageous effects of the preferred embodiments of the present invention are obtained and may be, for example, a circular shape, an elliptical shape, a polygonal shape, an L-shape, a T-shape, a Y-shape, or other suitable shape. In addition, although the power supply modules each having a rectangular or substantially rectangular parallelepiped shape have been described in the first, second, and third preferred embodiments, the present invention is not limited to this configuration. The shape of each of the power supply modules may be suitably changed as long as the advantageous effects of the preferred embodiments of the present invention are obtained. The surfaces of the power supply module excluding the mounting surface (the first outer surface VS1) are not limited to flat surfaces and may be curved surfaces and surfaces having other shapes.

In the above-described preferred embodiments, although the power supply modules each of which includes the control IC 3, the capacitors 21 (the input capacitor and the output capacitor), the switching elements 31 and 32, and the inductor 2 have been described, each of the power supply modules may include or does not need to include an electronic component other than these components. The plurality of electronic components may include, for example, a power inductor, a choke coil, a transformer.

In addition, the number, the type, the arrangement, and other parameters of the plurality of electronic components included in the power supply module may be suitably changed as long as the advantageous effects of the preferred embodiments of the present invention are obtained. Furthermore, each of the plurality of electronic components may be mounted either on the first surface PS1 of the substrate 1 or on the second surface PS2 of the substrate 1. However, as described in the second preferred embodiment, it is preferable that the switching elements 31 and 32 be mounted on one of the first surface PS1 and the second surface PS2, the one surface being different from the other surface on which the capacitors 21 (the input capacitor and the output capacitor) are mounted.

In each of the above-described preferred embodiments, although a configuration example has been described in which the six terminal electrodes P1, P2, P3, P4, P5, and P6 extend from a portion of the first outer surface VS1 to a portion of the second outer surface VS2 and are exposed at the first outer surface VS1 and the second outer surface VS2, the present invention is not limited to this configuration. The terminal electrodes may at least be exposed at the first outer surface VS1.

In each of the above-described preferred embodiments, although the case has been described in which the six terminal electrodes P1, P2, P3, P4, P5, and P6 are arranged in the first direction (the X-axis direction) along the ridge of the first outer surface VS1 and the second outer surface VS2, the present invention is not limited to this configuration. The number, the arrangement, and other parameters of the terminal electrodes may be suitably changed as long as the advantageous effects of the preferred embodiments of the present invention are obtained. In addition, each of the terminal electrodes is not limited to a metal block having a rectangular or substantially rectangular parallelepiped shape and may have an elliptical columnar shape, a polygonal columnar shape, or other suitable shaped, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A power supply module that includes a first outer surface and a second outer surface that is adjacent to the first outer surface and perpendicular or substantially perpendicular to the first outer surface, the power supply module comprising:
    a substrate that includes a first surface, a second surface that is opposite to the first surface and perpendicular or substantially perpendicular to the first outer surface, and a side surface;
    a plurality of electronic components that are mounted on the first surface and the second surface;
    a first resin member that is provided on the first surface and that seals the plurality of electronic components mounted on the first surface;
    a second resin member that is provided on the second surface and that seals the plurality of electronic components mounted on the second surface;
    a terminal electrode that is exposed at least at the first outer surface; and
    an inductor that is mounted on the first surface or the second surface and sealed by the first resin member or the second resin member; wherein
    in the substrate, the first surface is perpendicular or substantially perpendicular to the first outer surface;
    the first outer surface extends at least across the side surface of the substrate and the first resin member;
    an area of the first outer surface is smaller than an area of the second outer surface;
    the first outer surface further includes the second resin member;
    at least one of the plurality of electronic components is disposed at positions at which the at least one of the plurality of electronic components overlap the inductor when the first surface or the second surface is viewed in plan view;
    the plurality of electronic components include an input capacitor that is connected to an input portion, an output capacitor that is connected to an output portion, and a switching element that is connected between the inductor and the input capacitor or between the inductor and the output capacitor and that switches on and off a current that flows through the inductor;
    the input capacitor and the output capacitor are mounted on one of the first surface and the second surface; and
    the switching element is mounted on another one of the first surface and the second surface different from the one of the first surface and the second surface that the input capacitor and the output capacitor are mounted on.

2. The power supply module according to claim 1, wherein the switching element is disposed at a position at which at least a portion of the switching element overlaps at least one of the input capacitor and the output capacitor when the first surface or the second surface is viewed in plan view.

3. The power supply module according to claim 1, further comprising:
    a conductor that is provided in or on the substrate; wherein
    the switching element is disposed at a position at which at least a portion of the switching element overlaps the conductor when the first surface or the second surface is viewed in plan view.

4. The power supply module according to claim 1, wherein
    a plurality of the terminal electrodes are provided; and
    each of the plurality of terminal electrodes is exposed to at least the first outer surface.

5. The power supply module according to claim 1, wherein
    a plurality of the terminal electrodes are provided; and
    the plurality of terminal electrodes are disposed in a first direction along a ridge of the first outer surface and the second outer surface.

6. A power supply device comprising:
    a mounting substrate; and
    a plurality of power supply modules each of which includes a first outer surface and a second outer surface that is adjacent to the first outer surface and perpendicular or substantially perpendicular to the first outer surface; wherein
    each of the plurality of power supply modules includes:
        a substrate that includes a first surface and a side surface;
        a plurality of electronic components that are mounted at least on the first surface;
        a first resin member that is provided on the first surface and that seals the plurality of electronic components mounted on the first surface; and
        a terminal electrode that is exposed at least at the first outer surface;
    in the substrate, the first surface is perpendicular or substantially perpendicular to the first outer surface;
    the first outer surface extends at least across the side surface of the substrate and the first resin member;
    an area of the first outer surface is smaller than an area of the second outer surface; and
    the plurality of power supply modules are disposed in a second direction that is perpendicular or substantially perpendicular to a first direction along a ridge of the first outer surface and the second outer surface and are electrically connected in parallel to each other.

7. The power supply device according to claim 6, wherein the plurality of power supply modules are mounted on the mounting substrate with solder.

8. The power supply device according to claim 6, wherein
    the substrate further includes a second surface that is opposite to the first surface and perpendicular or substantially perpendicular to the first outer surface;
    at least one of the plurality of electronic components is mounted on the second surface;
    each of the plurality of power supply modules further includes a second resin member that is provided on the second surface and that seals the at least one of the plurality of electronic components mounted on the second surface; and the first outer surface includes the second resin member.

9. The power supply device according to claim 8, further comprising:

an inductor that is mounted on the first surface or the second surface and sealed by the first resin member or the second resin member; wherein at least one of the plurality of electronic components is disposed at positions at which the at least one of the plurality of electronic components overlaps the inductor when the first surface or the second surface is viewed in plan view.

10. The power supply device according to claim 9, wherein the plurality of electronic components include an input capacitor that is connected to an input portion, an output capacitor that is connected to an output portion, and a switching element that is connected between the inductor and the input capacitor or between the inductor and the output capacitor and that switches on and off a current that flows through the inductor;

the input capacitor and the output capacitor are mounted on one of the first surface and the second surface; and the switching element is mounted on another one of the first surface and the second surface different from the one of the first surface and the second surface that the input capacitor and the output capacitor are mounted on.

11. The power supply device according to claim 10, wherein the switching element is disposed at a position at which at least a portion of the switching element overlaps at least one of the input capacitor and the output capacitor when the first surface or the second surface is viewed in plan view.

12. The power supply device according to claim 10, further comprising:

a conductor that is provided in or on the substrate; wherein the switching element is disposed at a position at which at least a portion of the switching element overlaps the conductor when the first surface or the second surface is viewed in plan view.

13. The power supply device according to claim 9, wherein the plurality of electronic components includes an input capacitor that is connected to an input portion, an output capacitor that is connected to an output portion, and at least one switching element that is connected between the inductor and the input capacitor and between the inductor and the output capacitor and that switches on and off a current that flows through the inductor;

the input capacitor and the output capacitor are mounted on one of the first surface and the second surface; and the at least one switching element is mounted on another one of the first surface and the second surface, different from the one of the first surface and the second surface.

14. The power supply device according to claim 6, wherein a plurality of the terminal electrodes are provided; and each of the plurality of terminal electrodes is exposed to at least the first outer surface.

15. The power supply device according to claim 6, wherein a plurality of the terminal electrodes are provided; and the plurality of terminal electrodes are disposed in a first direction along a ridge of the first outer surface and the second outer surface.

16. A power supply module that includes a first outer surface and a plurality of outer surfaces that are adjacent to the first outer surface and perpendicular or substantially perpendicular to the first outer surface, the power supply module comprising:

a substrate that includes a first surface, a second surface that is opposite to the first surface, and a side surface;

a plurality of electronic components that are mounted on the first surface and the second surface;

a terminal electrode that is provided on the first surface; and a first resin member and a second resin member that are respectively provided on the first surface and the second surface and that seal the electronic components mounted on the first surface and the second surface;

in the substrate, the first surface and the second surface are perpendicular or substantially perpendicular to the first outer surface;

the first outer surface extends at least across the first resin member and the second resin member;

the terminal electrode is exposed at least at the first outer surface; and an area of the first outer surface is smaller than an area of any of the plurality of outer surfaces.

17. The power supply module according to claim 16, further comprising:

an inductor that is mounted on the second surface; wherein the terminal electrode is provided only on the first surface.

18. The power supply module according to claim 17, wherein the plurality of electronic components includes an input capacitor that is connected to an input portion, an output capacitor that is connected to an output portion, and at least one switching element that is connected between the inductor and the input capacitor and between the inductor and the output capacitor and that switches on and off a current that flows through the inductor; and the input capacitor and the output capacitor are mounted on one of the first surface and the second surface.

19. The power supply module according to claim 18, wherein the at least one switching element is disposed at a position at which at least a portion of the at least one switching element overlaps at least one of the input capacitor and the output capacitor when the first surface or the second surface is viewed in plan view.

20. The power supply module according to claim 16, wherein a plurality of the terminal electrodes are provided; and each of the plurality of terminal electrodes is exposed to at least the first outer surface.

* * * * *